(12) United States Patent
Hashemi et al.

(10) Patent No.: US 7,247,516 B1
(45) Date of Patent: Jul. 24, 2007

(54) METHOD FOR FABRICATING A LEADLESS CHIP CARRIER

(75) Inventors: Hassan S. Hashemi, Laguna Nigel, CA (US); Kevin Cote, Phoenix, AZ (US)

(73) Assignee: Skyworks Solutions, Inc., Woburn, MA (US)

( * ) Notice: Subject to any disclaimer, the term of this patent is extended or adjusted under 35 U.S.C. 154(b) by 162 days.

(21) Appl. No.: 11/256,511

(22) Filed: Oct. 21, 2005

Related U.S. Application Data (60) Division of application No. 09/878,815, filed on Jun. 11, 2001, now Pat. No. 6,960,824, and a continuation-in-part of application No. 09/713,834, filed on Nov. 15, 2000, now Pat. No. 6,921,972.

(51) Int. Cl.
*H01L 21/44* (2006.01)
*H01L 21/50* (2006.01)

(52) U.S. Cl. .............................. 438/106; 257/E23.067; 257/E21.499; 438/122

(58) Field of Classification Search .................... 438/6, 438/10, 104, 106–115, 117–118, 121–125, 438/128–129, 135, 142, 149, 151, 157, 176, 438/478
See application file for complete search history.

(56) References Cited

U.S. PATENT DOCUMENTS

| | | | | |
|---|---|---|---|---|
| 5,197,892 A | * | 3/1993 | Yoshizawa et al. ........... | 439/91 |
| 5,710,071 A | * | 1/1998 | Beddingfield et al. ....... | 438/108 |
| 6,373,131 B1 | * | 4/2002 | Karnezos ..................... | 257/712 |
| 6,586,274 B2 | * | 7/2003 | Murata ........................ | 438/106 |
| 2002/0135065 A1 | * | 9/2002 | Zhao et al. .................. | 257/738 |
| 2004/0070080 A1 | * | 4/2004 | Pendse ........................ | 257/778 |
| 2005/0077545 A1 | * | 4/2005 | Zhao et al. .................. | 257/202 |
| 2005/0087864 A1 | * | 4/2005 | Yang et al. .................. | 257/720 |
| 2006/0198147 A1 | * | 9/2006 | Ge ............................... | 362/294 |
| 2006/0292722 A1 | * | 12/2006 | Becker et al. ................ | 438/28 |

* cited by examiner

*Primary Examiner*—Scott B. Geyer
*Assistant Examiner*—Andre' Stevenson
(74) *Attorney, Agent, or Firm*—Farjami & Farjami LLP (57) ABSTRACT

Structure and method for fabrication of a leadless chip carrier have been disclosed. A disclosed embodiment comprises a substrate having a top surface for receiving a semiconductor die. The disclosed embodiment also comprises a printed circuit board attached to a bottom surface of the substrate. The disclosed embodiment further comprises at least one via in the substrate, which provides an electrical connection between a signal bond pad of the semiconductor die and the printed circuit board. The at least one via also electrically connects a substrate bond pad and the printed circuit board. The substrate bond pad is further connected to the signal bond pad of the semiconductor die by a signal bonding wire. The at least one via further provides an electrical connection between the signal bond pad of the semiconductor die and a land that is electrically connected to the printed circuit board.

16 Claims, 6 Drawing Sheets

METHOD FOR FABRICATING A LEADLESS CHIP CARRIER

This is a divisional of application Ser. No. 09/878,815 filed Jun. 11, 2001 now U.S. Pat. No. 6,960,824.

This application is a continuation in part of, and claims benefit of the filing date of, and hereby incorporates fully be reference, the parent application entitled "Leadless Chip Carrier Design and Structure" Ser. No. 09/713,834 filed Nov. 15, 2000 now U.S. Pat. No. 6,921,972 and assigned to the assignee of the present application.

BACKGROUND OF THE INVENTION

1. Field of the Invention

The present invention is generally in the field of semiconductor chip packaging. More specifically, the present invention is in the field of leadless chip carrier design and structure.

2. Background Art

The semiconductor fabrication industry is continually faced with a demand for smaller and more complex dies. These smaller and more complex semiconductor dies must also run at higher frequencies. The requirement of smaller, more complex, and faster devices has resulted in new challenges not only in the fabrication of the die itself, but also in the manufacturing of various packages, structures, or carriers that are used to house the die and provide electrical connection to "off-chip" devices.

As an example, the demand for higher frequencies means, among other things, that "on-chip" and "off-chip" parasitics must be minimized. For example, parasitic inductance, capacitance, and resistance, which all adversely affect electrical performance of the die and its associated off-chip components, must be minimized. Since RF ("Radio Frequency") semiconductor devices run at high frequencies, those devices (i.e. RF devices) constitute a significant category of devices that specially require very low parasitics.

Recently, surface mount chips and chip carriers have gained popularity relative to discrete semiconductor packages. A discrete semiconductor package typically has a large number of "pins" which may require a relatively large space, also referred to as the "footprint," to mount and electrically connect the discrete semiconductor package to a printed circuit board. Moreover, the cost and time associated with the manufacturing of the discrete semiconductor package and the cost and time associated with drilling a large number of holes in the printed circuit board are among additional reasons why alternatives such as surface mount devices and chip carriers have gained popularity.

There have been various attempts in the art to arrive at different chip carrier designs. Japanese Publication Number 10313071, published Nov. 24, 1998, titled "Electronic Part and Wiring Board Device," on which Minami Masumi is named an inventor, discloses a structure to dissipate heat emitted by a semiconductor device. The structure provides metallic packed through-holes formed in a wiring board that transmit heat emitted from a bare chip through a heat dissipation pattern on the bottom of the wiring board, and then to a heat dissipation plate.

Japanese Publication Number 02058358, published Feb. 27, 1990, titled "Substrate for Mounting Electronic Component," on which Fujikawa Osamu is named an inventor, discloses a substrate with a center area comprising eight thermally conductive resin-filled holes sandwiched between metal-plated top and bottom surfaces. An electronic component is then attached to the center area of the top metal-plated surface of the substrate with silver paste adhesive to improve heat dissipation and moisture resistance.

Japanese Publication Number 09153679, published Jun. 10, 1997, titled "Stacked Glass Ceramic Circuit Board," on which Miyanishi Kenji is named an inventor, discloses a stacked glass ceramic circuit board comprising seven stacked glass ceramic layers. The multi-layer stacked glass ceramic circuit board further comprises a number of via holes comprising gold or copper with surface conductors on the top and bottom surfaces covering the via holes. The top conductor functions as a heat sink for an IC chip.

Japanese Publication Number 10335521, published Dec. 18, 1998, titled "Semiconductor Device," on which Yoshida Kazuo is named an inventor, discloses a thermal via formed in a ceramic substrate, with a semiconductor chip mounted above the thermal via. The upper part of the hole of the thermal via is formed in a ceramic substrate in such a manner that it becomes shallower as it goes outward in a radial direction.

A conventional chip carrier structure for mounting a chip on a printed circuit board has a number of shortcomings. For example, conventional chip carriers still introduce too much parasitics and still do not provide a low inductance and resistance ground connection to the die. Conventional chip carriers also have a very limited heat dissipation capability and suffer from the concomitant reliability problems resulting from poor heat dissipation. As an example, in high frequency applications, such as in RF applications, a single die generates several watts of power. Since the semiconductor die and the chip carrier are made from different materials, each having a different coefficient of thermal expansion, they will react differently to the heat generated by the die. The resulting thermal stresses can cause cracking or a separation of the die from the chip carrier and, as such, can result in electrical and mechanical failures. Successful dissipation of heat is thus important and requires a novel structure and method.

Therefore, there exists a need for a novel and reliable structure and method to support, house, and electrically connect the semiconductor die to a printed circuit board to overcome the problems faced by discrete semiconductor packages and conventional chip carriers. More specifically, there exists a need for a novel and reliable structure and method to support, house, and electrically connect the semiconductor die to a printed circuit board while providing low parasitics, efficient heat dissipation and a low inductance and resistance ground connection.

SUMMARY OF THE INVENTION

The present invention is directed to structure and method for fabrication of a leadless chip carrier. The present invention discloses a structure that provides efficient dissipation of heat generated by the semiconductor die. The present invention further discloses a structure that provides low parasitics, and a low inductance and resistance ground connection.

In one embodiment, the present invention comprises a substrate having a top surface for receiving a semiconductor die. For example, the substrate can comprise organic material such as polytetrafluoroethylene material or an FR4 based laminate material. By way of further example, the substrate can comprise a ceramic material. The present invention further comprises a printed circuit board attached to a bottom surface of the substrate.

In one embodiment, the invention comprises at least one via in the substrate. The invention's at least one via provides an electrical connection between a signal bond pad of the die and the printed circuit board. The at least one via can comprise an electrically and thermally conductive material such as copper. The at least one via provides an electrical connection between a substrate bond pad and the printed circuit board. The at least one via can abut or overlap the substrate bond pad. The substrate bond pad is connected to the signal bond pad of the die by a signal bonding wire. The at least one via also provides an electrical connection between the signal bond pad of the die and a land that is electrically connected to the printed circuit board. Moreover, the at least one via can abut or overlap the land.

As described in the detailed description herein, the present invention's structure provides efficient dissipation of heat generated by the semiconductor die, while also providing low parasitics, and a low inductance and resistance ground connection.

DETAILED DESCRIPTION OF THE INVENTION

The present invention is directed structure and method for fabrication of a leadless chip carrier. The following description contains specific information pertaining to various embodiments and implementations of the invention. One skilled in the art will recognize that the present invention may be practiced in a manner different from that specifically discussed in the present application. Moreover, some of the specific details of the invention are not discussed in order not to obscure the invention. The specific details not described in the present application are within the knowledge of a person of ordinary skills in the art.

The drawings in the present application and their accompanying detailed description are directed to merely example embodiments of the invention. To maintain brevity, other embodiments of the invention that use the principles of the present invention are not specifically described in the present application and are not specifically illustrated by the present drawings.

Figure 1:
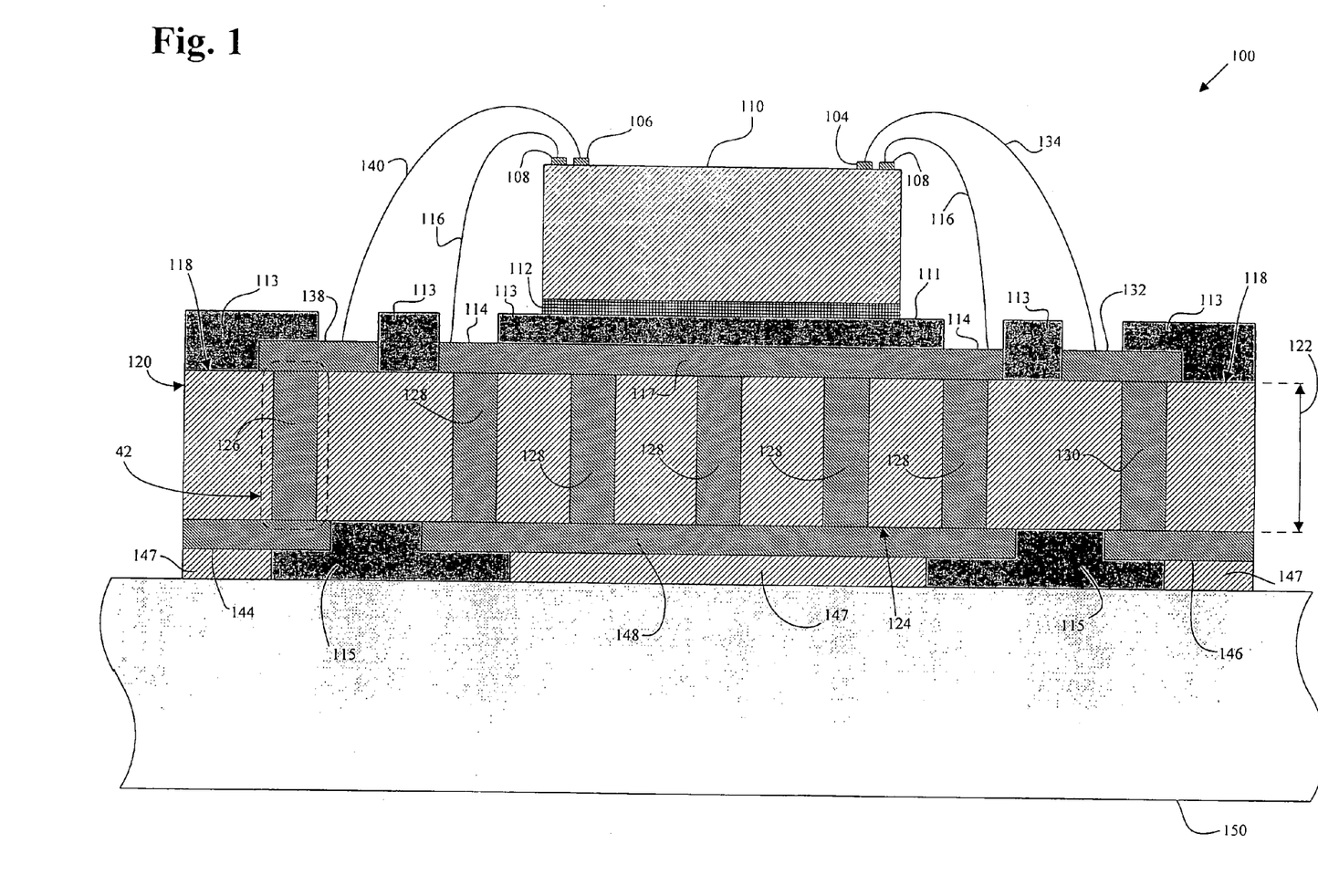
FIG. 1 illustrates a cross-sectional view of an embodiment of the present invention.

Structure 100 in FIG. 1 illustrates a cross-sectional view of an exemplary structure in accordance with one embodiment of the present invention. Structure 100 is shown as attached to printed circuit board ("PCB") 150 in FIG. 1. Referring to structure 100, semiconductor die 110 is attached to die attach pad 111 by die attach 112. It is noted that a "semiconductor die," such as semiconductor die 110, is also referred to as a "chip" or a "semiconductor chip" in the present application. Die attach pad 111 can be AUS-5 solder mask and it (i.e. die attach pad 111) refers to the segment of the solder mask directly below semiconductor die 110. The solder mask formation and patterning is discussed in more detail in later sections of the present application. However, die attach pad 111 may comprise materials other than solder mask. The thickness of die attach pad 111 can be, for example, 10.0 to 30.0 microns. Die attach 112 can comprise silver-filled epoxy or bismalemide. Generally die attach 112 can be an electrically conductive or electrically insulative, thermoset adhesive, or a combination thereof. However, in the present embodiment of the invention, die attach 112 is electrically and thermally conductive.

Solder mask 113 is applied to top surface 118 of substrate 120. The thickness of solder mask 113 can be, for example, 10.0 to 30.0 microns. Solder mask 113 can be AUS-5; however, solder mask 113 may comprise other materials. Solder mask 115 is applied to bottom surface 124 of substrate 120. The thickness of solder mask 115 can also be, for example, 10.0 to 30.0 microns. Solder mask 115 can also be AUS-5; however, solder mask 115 may comprise other materials. Support pad 117 is fabricated on top surface 118 of substrate 120 and, in one embodiment, support pad 117 can be copper. However, support pad 117 can comprise other metals. For example, support pad 117 can be aluminum, molybdenum, tungsten, or gold. It is noted that in one embodiment of the invention, semiconductor die 110 can be soldered directly to support pad 117. The fabrication of support pad 117 will be further described below in relation to FIG. 5.

Substrate down bond area 114 is fabricated on top surface 118 of substrate 120. In structure 100 in FIG. 1, substrate down bond area 114 can comprise nickel-plated copper. Substrate down bond area 114 can further comprise a layer of gold plating over the nickel-plated copper. However, substrate down bond area 114 can comprise other metals. For example, substrate down bond area 114 can be aluminum, molybdenum, tungsten, or gold. The fabrication of substrate down bond area 114 will be further described below in relation to FIG. 5. A first end of down bonding wire 116 is bonded to semiconductor die ground bond pad 108, on semiconductor die 110. A second end of down bonding wire 116 is bonded to substrate down bond area 114. Down bonding wire 116 can be gold, or can comprise other metals such as aluminum. The diameter of down bonding wire 116 can be approximately 30.0 microns or other diameter of choice.

Substrate 120 can comprise a two-layer organic laminate such as polytetrafluoroethylene. However, substrate 120 can comprise other organic materials such as FR4 based laminate. In one embodiment of the present invention, substrate 120 can be a ceramic material. In structure 100 in FIG. 1, thickness 122 of substrate 120 is approximately 200.0 microns; however, the thickness of substrate 120 can be different in other embodiments of the invention.

Continuing with FIG. 1, vias 128, also referred to as a first plurality of vias, and via 126 and via 130, also referred to as a second plurality of vias, are situated within substrate 120. Via 126, via 130, and vias 128 extend from top surface 118 to bottom surface 124 of substrate 120. Vias 126, via 130, and vias 128 can comprise a thermally conductive material. Vias 126, via 130, and vias 128 can comprise copper and, in fact, in exemplary structure 100, via 126, via 130, and vias 128 are filled with copper. However, via 126, via 130, and vias 128 can be filled with other metals without departing from the scope of the present invention. In another embodiment of the present invention, via 126, via 130, and vias 128 may not be completely filled with a metal. Generally, vias 128, via 126, and via 130 have similar structures. As such, and by way of an illustrative example, the structure of exemplary via 126 will be described in greater detail in relation to FIGS. 2A and 2B, and specifically with respect to the region enclosed by dashed line 142 (which corresponds to the region enclosed by dashed line 242 in FIG. 2B).

As shown in FIG. 1, a first end of signal bonding wire 134 is bonded to semiconductor die signal bond pad 104 on semiconductor die 110. A second end of signal bonding wire 134 is bonded to substrate signal bond pad 132. Signal bonding wire 134 can be gold or can comprise other metals such as aluminum. The diameter of signal bonding wire 134 can be 30.0 or other diameter of choice. As further shown in FIG. 1, a first end of signal bonding wire 140 is bonded to semiconductor die signal bond pad 106 on semiconductor die 110. A second end of signal bonding wire 140 is bonded to substrate signal bond pad 138. Signal bonding wire 140 can be gold or can comprise other metals such as aluminum. The diameter of signal bonding wire 140 can be 30.0 or other diameter of choice.

In FIG. 1, substrate signal bond pad 132 is fabricated on top surface 118 of substrate 120. In structure 100, substrate signal bond pad 132 can comprise nickel-plated copper. Substrate signal bond pad 132 can further comprise a layer of gold plating over the nickel-plated copper. However, substrate signal bond pad 132 can comprise other metals. For example, substrate signal bond pad 132 can be aluminum, molybdenum, tungsten, or gold. The fabrication of substrate signal bond pad 132 will be further described below in relation to FIG. 5. In structure 100 in FIG. 1, substrate signal bond pad 132 overlaps via 130. In another embodiment of the present invention, instead of overlapping via 130, substrate signal bond pad 132 "abuts" via 130.

Similar to substrate signal bond pad 132, substrate signal bond pad 138 is fabricated on top surface 118 of substrate 120. In structure 100, substrate signal bond pad 138 can comprise nickel-plated copper. Substrate signal bond pad 138 can further comprise a layer of gold plating over the nickel-plated copper. However, substrate signal bond pad 138 can comprise other metals. For example, substrate signal bond pad 138 can be aluminum, molybdenum, tungsten, or gold. The fabrication of substrate signal bond pad 138 will be further described below in relation to FIG. 5. In structure 100, substrate signal bond pad 138 overlaps via 126. In another embodiment of the present invention, substrate signal bond pad 138 abuts via 126.

Also shown in FIG. 1, land 144 is fabricated on bottom surface 124 of substrate 120. In structure 100, land 144 can comprise copper; however, land 144 can comprise other metals such as aluminum, molybdenum, tungsten, or gold. The fabrication of land 144 will be further described below in relation to FIG. 5. Land 144 is attached to printed circuit board ("PCB") 150 by solder 147. However, other methods known in the art may be used to attach land 144 to PCB 150. In structure 100, land 144 overlaps via 126. In another embodiment of the present invention, instead of overlapping via 126, land 144 abuts via 126.

Similar to land 144, land 146, is fabricated on bottom surface 124 of substrate 120. In structure 100, land 146 can be copper; however, land 146 can comprise other metals such as aluminum, molybdenum, tungsten, or gold. The fabrication of land 144 will be further described below in relation to FIG. 5. In structure 100 in FIG. 1, land 146 is attached to PCB 150 by solder 147. However, other methods known in the art may be used to attach land 146 to PCB 150.

In structure 100, land 146 overlaps via 130. In another embodiment of the present invention, land 144 can abut via 126.

Further shown in FIG. 1, heat spreader 148 is fabricated on bottom surface 121 of substrate 120. In structure 100, heat spreader 148 can be copper; however, heat spreader 148 can comprise other metals such as aluminum, molybdenum, tungsten, or gold. In exemplary structure 100, heat spreader 148 is attached to PCB 150 by solder 147. However, other methods known in the art may be used to attach heat spreader 148 to PCB 150. The fabrication of heat spreader 148 will be discussed in detail in relation to FIG. 5.

Figure 2A:
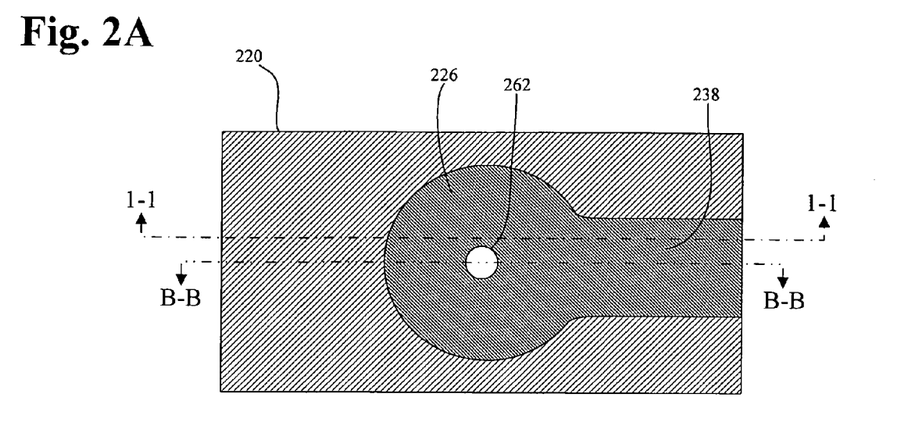
FIG. 2A illustrates a top view of a portion of an embodiment of the present invention.
Figure 2B:
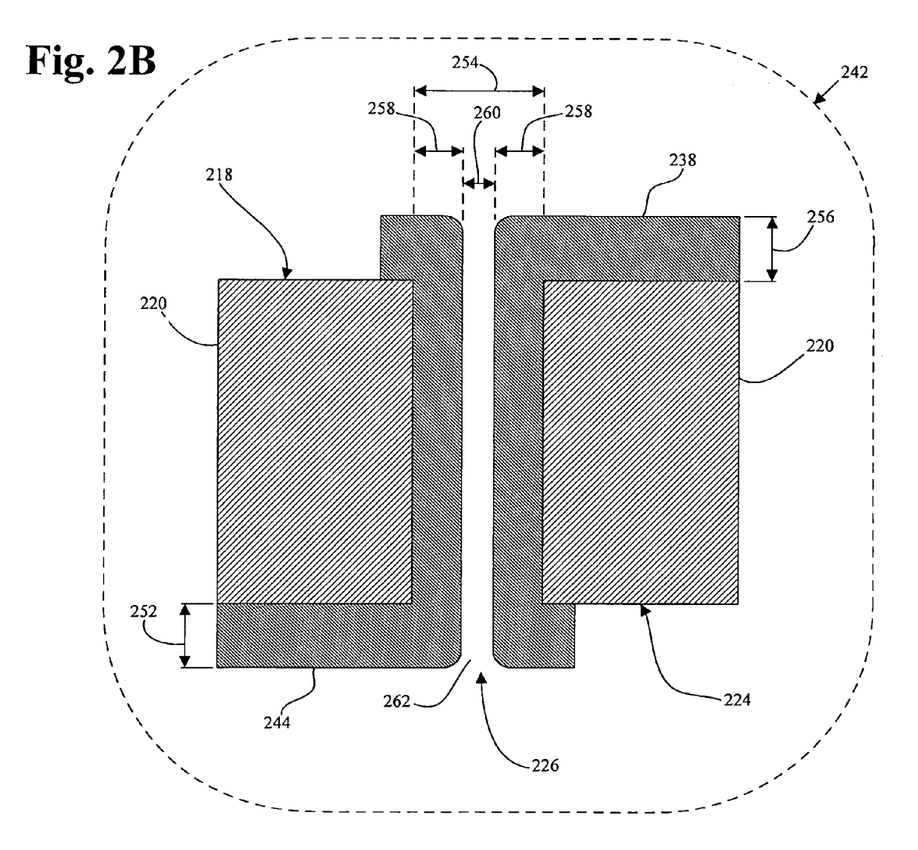
FIG. 2B illustrates a cross-sectional view of a portion of an embodiment of the present invention.

FIG. 2A shows a top view of region 242 in FIG. 2B, which corresponds to region 142 in FIG. 1. In particular, substrate 220, via 226, and substrate signal bond pad 238, respectively, correspond to substrate 120, via 126, and substrate signal bond pAd 138 in FIG. 1. FIG. 2A also shows via hole 262. Via hole 262 cannot be seen in FIG. 1 which is a cross-sectional view along line 1-1 of FIG. 2A. However, via hole 262 can be seen in FIG. 2B since FIG. 2B is a cross-sectional view along line B-B of FIG. 2A. Via 226, bond pad 238, and via hole 262 will be described in detail below in relation to FIG. 2B.

FIG. 2B shows a cross-sectional view of region 242 along line B-B of FIG. 2A. However, region 142 in FIG. 1 shows a cross-sectional view along line 1-1 of FIG. 2A. In particular, top surface 218, substrate 220, bottom surface 224, via 226, substrate signal bond pad 238, and land 244 correspond, respectively, to top surface 118, substrate 120, bottom surface 124, via 126, substrate signal bond pad 138, and land 144 in FIG. 1.

In FIG. 2B, land pad thickness 252 can be approximately 12.7 to 30.0 microns. Via drill diameter 254 can be 150.0 microns while bond pad thickness 256 can be approximately 12.7 to 30.0 microns. Via wall thickness 258 can be approximately 20.0 microns. Via hole diameter 260 can be approximately 110.0 microns. It is noted that, for the purpose of ease of illustration, the various dimensions in FIGS. 2A and 2B are not drawn to scale.

The fabrication of via 226 begins with substrate 220. In one embodiment of the present invention, copper can be laminated on top surface 218 and bottom surface 224 of substrate 220. The thickness of the copper laminated on top surface 218 and bottom surface 224 of substrate 220 can be, for example, 15.0 microns. However, other metals may be laminated on top surface 218 and bottom surface 224 of substrate 220. For example, the metal laminated on top surface 218 and bottom surface 224 of substrate 220 can be aluminum, molybdenum, tungsten, or gold. Next, a via opening having via drill diameter 254 is drilled through substrate 220 at a predetermined location. Substrate 220 is then plated with copper to produce a layer of copper on the inside of the via opening corresponding to via wall thickness 258. However, substrate 220 may be plated with other metals. Thus, via 226 is fabricated having via hole diameter 262 as shown in FIGS. 2A and 2B. The process illustrated above to fabricate via 226 also applies to the fabrication of via 130 and vias 128 in structure 100 in FIG. 1.

Figure 3:
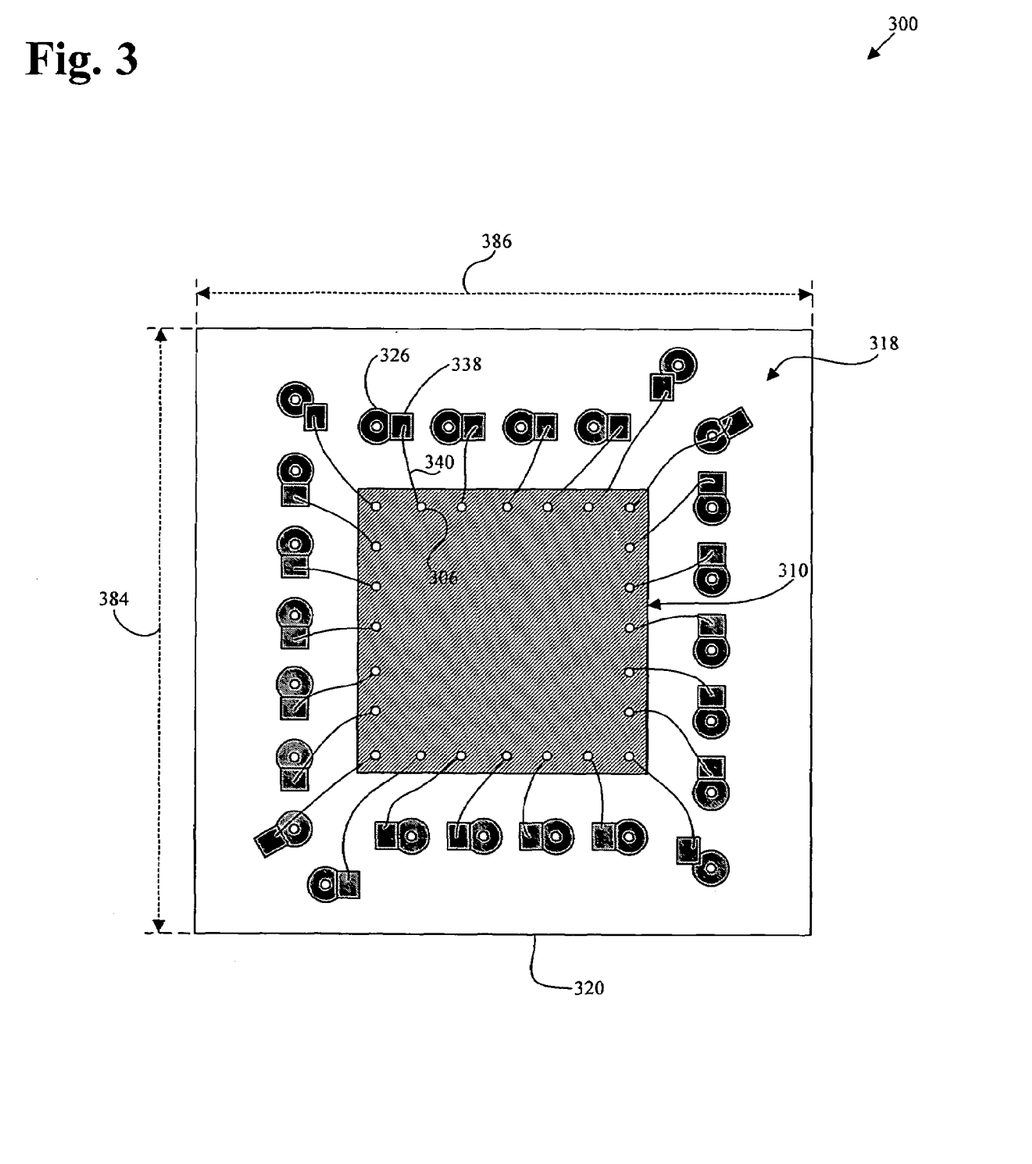
FIG. 3 illustrates a top view of an embodiment of the present invention after completion of a "saw singulation" step.

Structure 300 in FIG. 3 illustrates a top view of an exemplary structure in accordance with one embodiment of the present invention after completion of a "saw singulation" step which, briefly, involves dicing substrate 120 (FIG. 1) so as to achieve a "singulated" structure such as structure 100 in FIG. 1, corresponding to structure 300 in FIG. 3. The saw singulation step is one of the last steps in a process that is described in more detail in relation to FIG. 5. Structure 300 thus comprises substrate 320 corresponding to substrate 120 in FIG. 1. However, in contrast to structure 100 in FIG. 1, in structure 300 substrate bond pads abut, instead of overlap, the vias. For example, substrate signal bond pad 338 is shown as abutting, and not overlapping, via 326. This is in contrast to substrate signal bond pad 138 in FIG. 1, which is shown as overlapping, and not abutting, via 126. Continuing with structure 300, a first end of bonding wire 340 is bonded to substrate signal bond pad 338. A second end of bonding wire 340 is bonded to semiconductor die signal bond pad 306 on semiconductor die 310. It is noted that in FIG. 3, only via 326, substrate signal bond pad 338, bonding wire 340, and semiconductor die signal bond pad 306 are specifically discussed herein to preserve brevity.

The shape of structure 300 in FIG. 3 can be square. For example, side 384 and side 386 of substrate 320 in singulated structure 300 can each be 4.0 millimeters. By way of other examples, other square-shaped "package sizes" can be 5.0 millimeters by 5.0 millimeters, 6.0 millimeters by 6.0 millimeters, or 7.0 millimeters by 7.0 millimeters. In another embodiment, the shape of structure 300 can be rectangular. The "package size" of a rectangular-shaped embodiment can be 3.9 millimeters by 4.9 millimeters. By way of other examples, other "package sizes" of the rectangular-shaped embodiment can be 4.4 millimeters by 6.5 millimeters or 4.4 millimeters by 7.8 millimeters.

Figure 4:
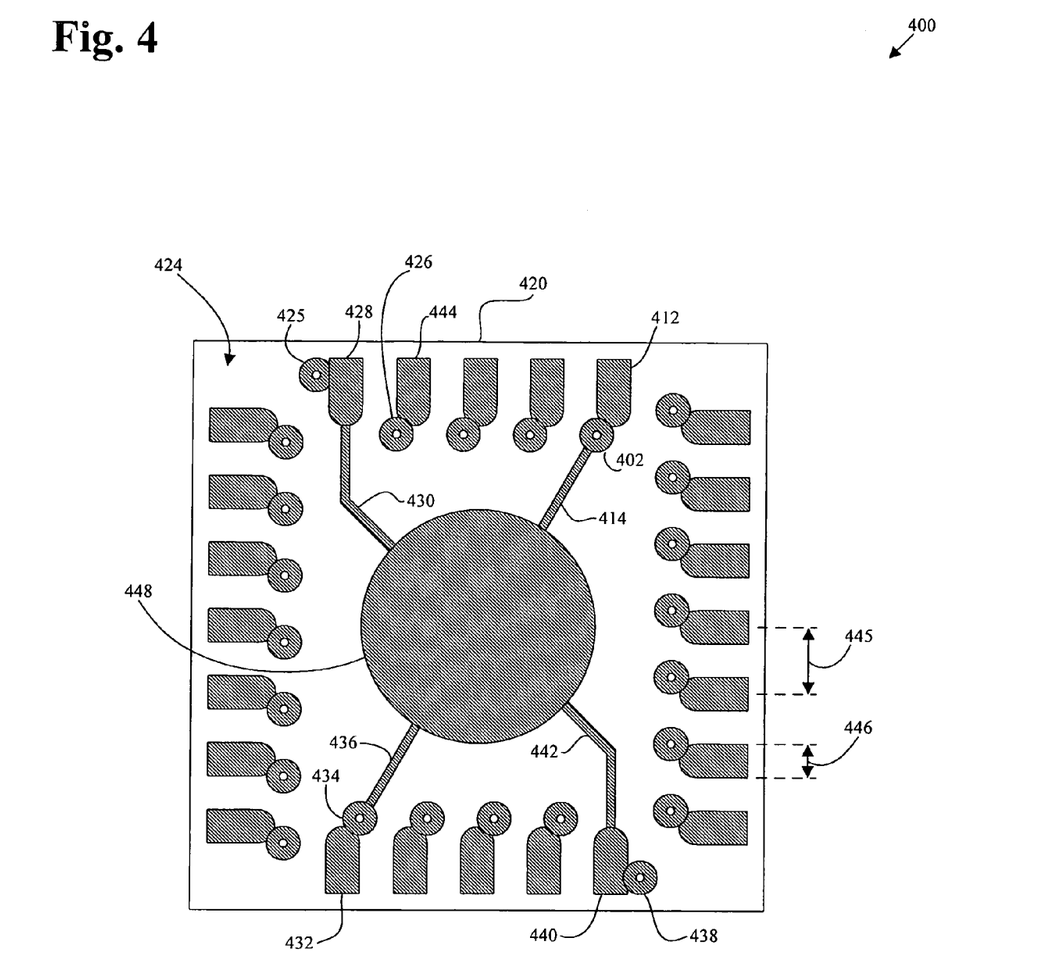
FIG. 4 illustrates a bottom view of an embodiment of the present invention after completion of a "saw singulation" step.

Structure 400 in FIG. 4 illustrates a bottom view of an exemplary structure in accordance with one embodiment of the present invention after completion of a "saw singulation" step. Structure 400 comprises substrate 420 corresponding to substrate 120 in FIG. 1. However, in contrast to structure 100 in FIG. 1, in structure 400 lands abut, instead of overlap, the vias. For example, land 444 is shown abutting, and not overlapping, via 426. This is in contrast to land 144 in FIG. 1, which is shown as overlapping, and not abutting, via 126. Additionally, traces that connect lands and vias to a heat spreader, such as traces 414, 430, 436, and 442 in FIG. 4, are not shown in structure 100 in FIG. 1.

Now discussing FIG. 4 in more detail, FIG. 4 shows bottom surface 424 of substrate 420. Lands 412, 428, 432, 440 and 444, respectively, abut vias 402, 425, 434, 438 and 426. Trace 414 connects via 402 and heat spreader 448. Trace 436 connects via 434 and heat spreader 448. Trace 430 connects land 428 and heat spreader 448. Trace 442 connects land 440 and heat spreader 448. Therefore, vias 402, 425, 434, and 438, respectively, are connected by traces 414, 430, 436, and 442 to heat spreader 448. In the exemplary embodiment shown in FIG. 4, "land pitch" 445 can be, for example, 500.0 microns and "land width" 446 can be, for example, 250.0 microns. It is noted that in FIG. 4, only vias 402, 425, 426, 434, and 438 and lands 412, 428, 432, 440, and 444 are specifically discussed herein to preserve brevity. In another embodiment, "ground traces," such as traces 414, 430, 436, and 442 in FIG. 4, are not used at all. As such lands 412, 428, 432, and 440 in FIG. 4, would not be connected to a ground, such as heat spreader 448 in FIG. 4, but would be used as ordinary "signal" lands.

Figure 5:
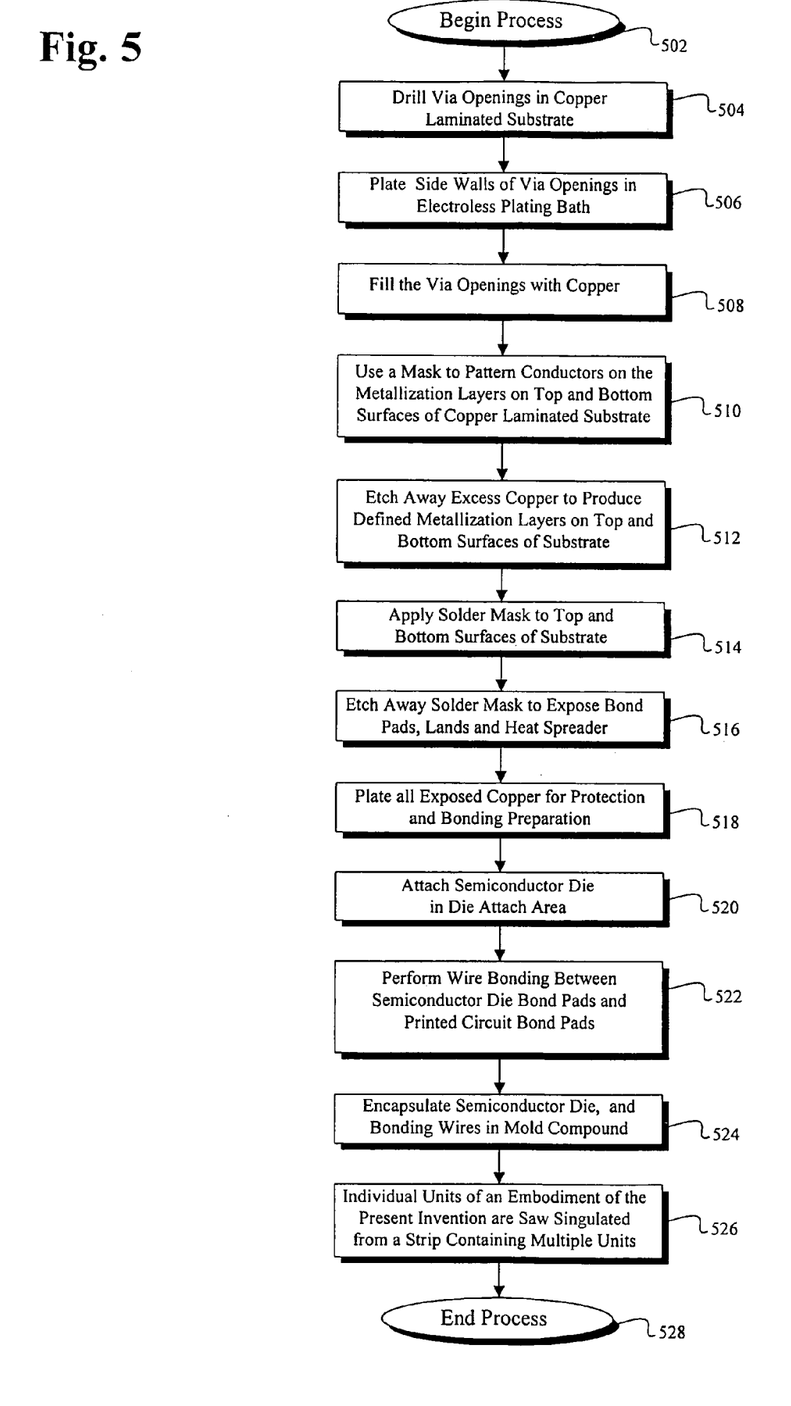
FIG. 5 illustrates a flow chart of an exemplary process by which an embodiment of the present invention is fabricated.

Referring to FIG. 5, an example of a process by which structure 100 in FIG. 1 is fabricated is now discussed. At step 502 the process begins. At step 504, via openings are drilled in a strip of copper laminated substrate. For example, the strip can be an 18-inch by 24-inch panel of copper laminated substrate. Substrate 120 in FIG. 1 corresponds to a section of the strip of the copper laminated substrate. Typically, multiple units of structure 100 are assembled on the strip of copper laminated substrate. In a later step in the assembly process, multiple assembled units of structure 100 are separated into individual units. The diameter of the via openings drilled in the copper laminated substrate can be approximately 150.0 microns.

Typically, all via openings are drilled at once using multiple diamond bits. At step 506, the sidewalls of the via openings are plated with copper in an electroless plating bath. By way of background, electroless plating refers to a method of plating that involves the deposition of metals such as copper, nickel, silver, gold, or palladium on the surface of a variety of materials by means of a reducing chemical bath. As a result of the electroless plating bath, the vias provide electrical and thermal conduction between the top and bottom surfaces of the copper laminated substrate. In one embodiment, after completion of the electroless plating process, the via hole diameter, such as via hole diameter 260 in FIG. 2B, is approximately 110.0 microns.

At step 508, the vias openings are filled with copper. Adding additional copper to the via openings increases the thermal conductivity of the vias by providing a larger cross-sectional area for thermal flow. Also, providing a larger cross-sectional area for electrical current flow increases the electrical conductivity of the vias. In the present embodiment, the via openings are partially (or almost completely) filled with copper, while in another embodiment the via openings are completely filled with copper. In one embodiment of the invention, the vias are filled with tungsten. In that embodiment, the tungsten-filled vias are strong enough to allow bonding directly onto the vias.

At step 510, a mask is used to pattern conductors on the metallization layers on the top and bottom surfaces of the substrate. In the present exemplary embodiment, the metallization layers can be copper. At step 512, the excess copper is etched away, resulting in a defined metal interconnect or metal trace pattern, also referred to as a printed circuit, on the top and bottom surfaces of the substrate. For example, in structure 400 in FIG. 4, a patterned metallization layer on bottom surface 424 includes, among other things, heat spreader 448, lands 412, 418, 428, 432, and 440, and traces 414, 430, 436, and 442.

In step 514, solder mask is applied to the top and bottom surfaces of the substrate, thereby covering the exposed patterned copper on the top and bottom surfaces of the substrate. Solder mask improves the adhesive quality of the die attach used to secure the semiconductor die to the top surface of the substrate. For example, in structure 100 in FIG. 1, solder mask 113 improves the adhesive quality of die attach 112 in securing semiconductor die 110 to top surface 118 of substrate 120. Solder mask also prevents contamination of the substrate signal bond pads, substrate down bond areas, and lands.

In step 516, solder mask is etched away to expose copper in the printed circuit areas where bonding and soldering would take place. For example, solder mask is etched away to expose substrate down bond area 114, substrate signal bond pads 132 and 138, lands 144 and 146, and heat spreader 148 in FIG. 1. In step 518, the exposed copper in the printed circuit areas, where bonding and soldering would take place, is plated with a layer of nickel, followed by a layer of gold plating on top of the nickel plated copper. The gold/nickel plating protects the exposed copper from oxidation. Also, the gold/nickel plating prepares the exposed copper for bonding at the bond pads and substrate down bond areas of the printed circuit, such as substrate signal bond pads 132 and 138 and substrate down bond area 114 in FIG. 1. Additionally, the gold/nickel plating prepares the exposed copper for soldering at the printed circuit lands and heat spreader, such as lands 144 and 146 and heat spreader 148 in FIG. 1.

At step 520, a semiconductor die is attached to the die attach pad with a die attach material. In structure 100 in FIG. 1, for example, semiconductor die 110 is attached to die attach pad 111 with die attach 112. As stated above, die attach pad 111 can be AUS-5 solder mask and it (i.e. die attach pad 111) refers to the segment of the solder mask directly below semiconductor die 110. The die attach material, for example, attach 112 shown in FIG. 1, can comprise silver-filled epoxy or bismalemide. Generally the die attach material can be an electrically conductive or electrically insulative, thermoset adhesive, or a combination thereof. In another embodiment of the present invention, the semiconductor die can be directly soldered to a support pad, such as support pad 117 in FIG. 1.

At step 522, wire bonding is performed between semiconductor die bond pads, such as semiconductor die signal bond pads 104 and 106 in FIG. 1, and printed circuit bond pads, such as substrate signal bond pads 132 and 138 in FIG. 1. In structure 300 in FIG. 3, for example, wire bonding is performed between semiconductor die bond pad 306 and substrate signal bond pad 338. In structure 100 in FIG. 1, the bonding wires used for wire bonding, such as signal bonding wires 134 and 140, can comprise gold. At step 524, the semiconductor die and the bonding wires, such as semiconductor die 110, signal bonding wires 134 and 140, and down bonding wire 116 in FIG. 1, are encapsulated in an appropriate mold compound. The mold compound provides protection from chemical contamination or physical damage in subsequent manufacturing processes and during use. The mold compound, for example, can comprise various chemical compounds, such as multifunctional epoxy, novolac, and biphenyl resin, or a combination thereof.

At step 526, the strip containing multiple assembled units of structure 100 is saw singulated into individual units. In saw singulation, individual assembled units of structure 100 are diced from the strip containing multiple assembled units of structure 100 to result in a large number of structures such as structure 100. It is noted that the process described by reference to FIG. 5 is only one method of fabricating structure 100 in FIG. 1. It is also noted that variations and modifications to the overall method or to each individual step discussed in relation to FIG. 5 are obvious to a person of ordinary skill in the art. At step 528, the exemplary process by which structure 100 in FIG. 1 is fabricated ends.

Figure 6:
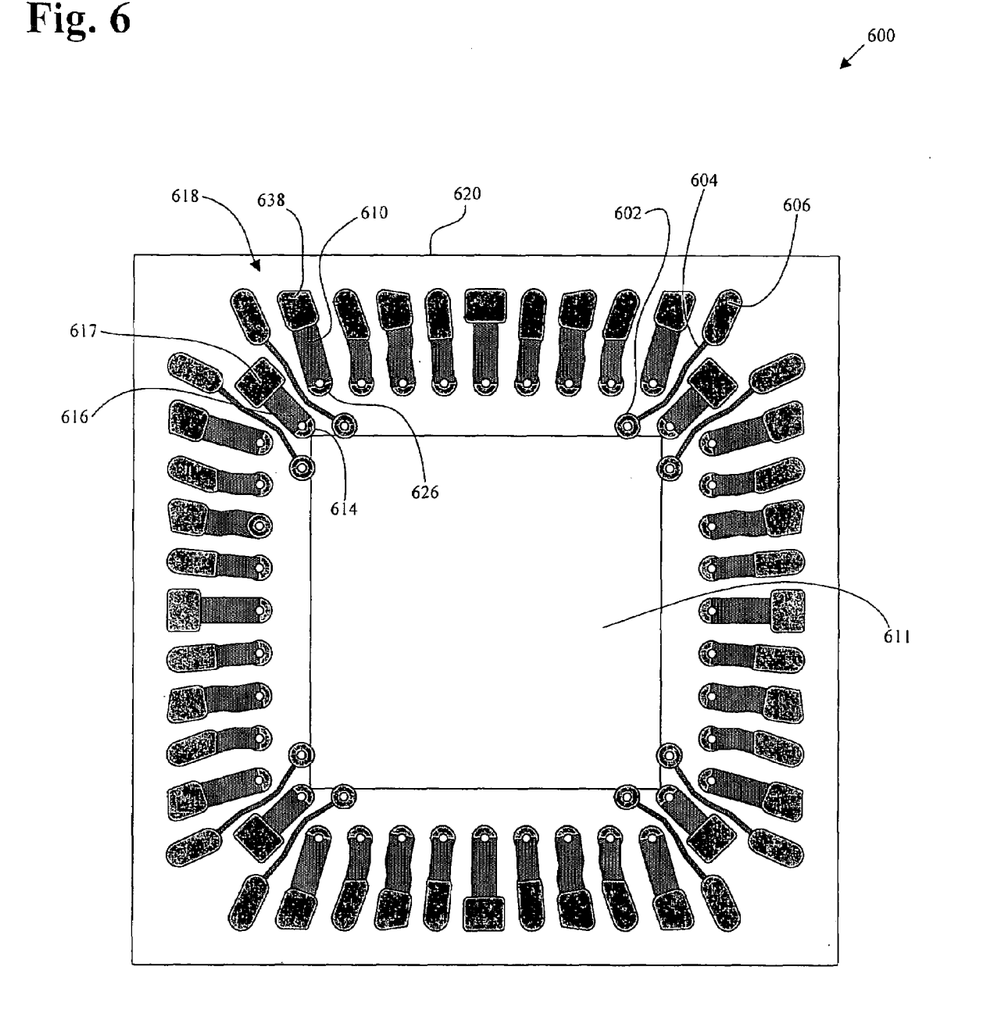
FIG. 6 illustrates a top view of an embodiment of the present invention after completion of a "saw singulation" step.

Structure 600 in FIG. 6 illustrates a top view of an exemplary structure in accordance with one embodiment of the present invention after completion of a "saw singulation" step. However, the semiconductor die and bonding wires are not shown in FIG. 6. Structure 600 comprises substrate 620 corresponding to substrate 120 in FIG. 1. However, in contrast to structure 100 in FIG. 1, in structure 600 substrate bond pads are connected to vias by traces. For example, trace 610 connects substrate signal bond pad 638 and via 626. In contrast, in structure 100 in FIG. 1, the bond pads overlap the vias. For example, substrate signal bond pad 138 overlaps via 126 in FIG. 1.

FIG. 6 shows top surface 618 of substrate 620. Trace 604 connects substrate bond pad 606 and via 602. As stated above, trace 610 connects substrate bond pad 638 and via 626. Trace 616 connects substrate bond pad 617 and via 614. FIG. 6 also shows the top view of die attach pad 611. It is noted that in FIG. 6, only vias 602, 626, and 614, traces 604, 610, and 616, and substrate bond pads 606, 617, and 638 are specifically discussed herein to preserve brevity.

In structure 600 in FIG. 6, via 602 is situated adjacent to die attach pad 611. Via 602 can be connected to a common ground connection, not shown in FIG. 6, such as support pad 117 in structure 100 in FIG. 1. Via 614 is situated at a corner of die attach pad 611. In structure 600, via 614 can be connected to a common ground connection, not shown in FIG. 6, such as support pad 117 in structure 100 in FIG. 1. In structure 600 in FIG. 6, "peripheral" vias, such as via 626, typically function as "signal" vias.

As stated above, in structure 600 in FIG. 6, traces 604, 610, and 616, respectively, connect substrate bond pads 606, 638, and 617 to vias 602, 626, and 614. Traces 604, 610, and 616 have different lengths. As seen in FIG. 6, substrate bond pads 606, 638, and 617, respectively, are at different distances from vias 602, 626, and 614. Also, trace 604 and trace 616 have different widths. As such, structure 600 in FIG. 6 provides design flexibility in the utilization of various substrate bond pad and via locations, trace lengths and trace widths.

The electrical and thermal characteristics of structure 100 in FIG. 1 will now be discussed. In structure 100, down bonding wire 116 provides an electrical ground connection between semiconductor die ground bond pad 108 on semiconductor die 110 and substrate down bond area 114. Substrate down bond area 114 is situated in close proximity to semiconductor die 110. By situating substrate down bond area 114 in close proximity to semiconductor die 110, structure 100 provides a minimal length electrical ground connection between semiconductor die ground bond pad 108 and substrate down bond area 114.

Support pad 117 functions as a "ground plane" for semiconductor die 110 by providing semiconductor die ground bond pads with a large common ground connection. Thus, semiconductor die ground pad 108 is electrically connected to substrate down bond area 114 by down bonding wire 116, and substrate down bond area 114 is part of support pad 117. Since substrate down bond area 114 is part of support pad 117, structure 100 provides a minimal length electrical ground connection between semiconductor die ground pad 108 and support pad 117. Also, vias 128 electrically connect support pad 117 and heat spreader 148. Thus, substrate down bond area 114, support pad 117, vias 128, and heat spreader 148 combine to provide a minimal length, low resistance, and low inductance ground connection between semiconductor die ground pad 108 and heat spreader 148.

Additionally, in structure 100 in FIG. 1, a large number of vias 128 can be used. Since vias 128 are electrically connected in parallel between support pad 117 and heat spreader 148, they (i.e. vias 128) provide a much lower resistive and inductive path between support pad 117 and heat spreader 148 than the resistive and inductive path that would have been provided by a single via. Thus, through the utilization of multiple vias, such as vias 128 in FIG. 1, structure 100 provides a low resistance, low inductance, minimal length electrical ground connection between support pad 117 and heat spreader 148.

One advantage of structure 100 in FIG. 1 is that substrate down bond area 114 is of sufficient size to allow a procedure known as "double bonding" to further minimize the parasitic inductance and resistance generated by down bonding wire 116. In "double bonding," two down bonding wires are connected in parallel between a semiconductor die ground bond pad and a substrate down bond area. In structure 100, for example, two down bonding wires can be connected between semiconductor die ground bond pad 108 on semiconductor die 110 in FIG. 1, and substrate down bond area 114. The parasitic inductance and resistance generated by two parallel down bonding wires between semiconductor die ground bond pad 108 and substrate down bond area 114 would be approximately one half the parasitic inductance ard resistance generated by a single down bonding wire.

In the embodiment of the invention shown in FIG. 1, substrate signal bond pads 132 and 138, respectively, overlap vias 130 and 126. Also, lands 146 and 144, respectively, overlap vias 130 and 126. Thus, vias 130 and 126 provide minimal length electrical connections between substrate signal bond pads 132 and 138, respectively, and lands 146 and 144. As such, through the utilization of "overlapping" vias 130 and 126, respectively, structure 100 minimizes the parasitic inductance generated between substrate signal bond pads 132 and 138, and lands 146 and 144. In other words, the fact that no interconnect lines are required to connect to vias 130 and 126 results in a reduction of parasitic inductance and resistance that would otherwise be introduced by the interconnect lines.

It is necessary to thermally conduct excess heat away from a semiconductor die to prevent damage to the semiconductor die. Structure 100 in FIG. 1 provides thermal conduction of excess heat away from semiconductor die 110 by way of support pad 117, vias 128, and heat spreader 148. In structure 100, vias 128 can be filled with a thermally conductive metal such as copper. Adding additional copper to vias 128 increases their cross-sectional area. Thus, providing a larger cross-sectional area through which heat can be thermally conducted increases the thermal conductivity of vias 128. In structure 100, support pad 117 can be a thermally conductive metal such as copper. Also, the large surface area of support pad 117 provides a large conduit for the conduction of heat generated by semiconductor die 110. Similarly, heat spreader 148 can be a thermally conductive metal such as copper and the large surface area of heat spreader 148 provides a large conduit for the conduction of heat flowing through vias 128. Vias 128 also provide an efficient and "multiple" thermal connection between support pad 117 and heat spreader 148. Thus, through the utilization of support pad 117, vias 128, and heat spreader 148, structure 100 provides an effective mechanism to dissipate heat generated by semiconductor die 110.

It is noted that a difference may exist in the coefficient of thermal expansion ("CTE") of structure 100 in FIG. 1, and PCB 150 because of a difference in the materials used to fabricate structure 100 and PCB 150. As a result, when structure 100 heats up due to operating or environmental factors, structure 100 may expand at a different rate than PCB 150. The difference in the rate of expansion of structure 100 and PCB 150 creates a corresponding strain on the "solder joint" that connects stricture 100 and PCB 150. The "solder joint" comprises the individual solder connections, referred to as solder 147 in FIG. 1, between PCB 150 and lands 144 and 146, and the solder connection, also referred to as solder 147, between PCB 150 and heat spreader 148. However, heat spreader 148 is much larger in size than lands 144 and 146. The proportionally larger size of heat spreader 148 allows heat spreader 148 to absorb a corresponding larger amount of the overall strain on its "solder joint." Therefore, heat spreader 148 increases the physical reliability of structure 100 by absorbing a large amount of the overall strain on its "solder joint."

It is appreciated by the above detailed description that the invention provides structure and method for fabrication of a leadless chip carrier. The invention provides efficient dissipation of heat generated by the semiconductor die. Further, the invention provides low parasitics, and a low inductance and resistance ground connection.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, structure and method for fabrication of a leadless chip carrier have been described.

The invention claimed is:

1. A method for fabricating a structure for receiving a semiconductor die, said method comprising steps of:
   drilling a first hole in a substrate;
   filling said first hole with metal to form a first via;
   patterning a support pad on a top surface of said substrate, and patterning a heat spreader on a bottom surface of said substrate, said first via providing an electrical connection between said heat spreader and said support pad, said support pad being suitable for receiving said semiconductor die.

2. The method of claim 1 further comprising the steps of:
   drilling a second hole in said substrate;
   filling said second hole with metal to form a second via;
   patterning a substrate bond pad on said top surface of said substrate, and patterning a land on said bottom surface of said substrate, said second via providing an electrical connection between said substrate bond pad and said land.

3. The method of claim 2 further comprising the step of attaching said semiconductor die to said support pad.

4. The method of claim 3 further comprising the step of patterning a substrate down bond area on said top surface of said substrate, said substrate down bond area being electrically connected to said support pad.

5. The method of claim 4 further comprising the step of electrically connecting a ground bond pad of said semiconductor die to said substrate down bond area by a down bonding wire.

6. The method of claim 3 further comprising the step of electrically connecting a signal bond pad of said semiconductor die to said substrate bond pad by a signal bonding wire, wherein said signal bond pad of said semiconductor die is electrically connected to said land.

7. The method of claim 3 further comprising the step of soldering a printed circuit board to said heat spreader, wherein said printed circuit board is electrically connected to said support pad.

8. The method of claim 1 wherein said first via provides a thermal connection between said heat spreader and said support pad.

9. The method of claim 1 wherein said heat spreader is a thermal conductor.

10. The method of claim 1 wherein said support pad is a thermal conductor.

11. The method of claim 1 wherein said via comprises copper.

12. The method of claim 1 wherein said substrate comprises organic material.

13. The method of claim 12 wherein said organic material is selected from the group consisting of polytetrafluoroethylene material and an FR4 based laminate material.

14. The method of claim 1 wherein said substrate comprises a ceramic material.

15. The method of claim 1 wherein said heat spreader comprises copper.

16. The method of claim 1 wherein said support pad comprises copper.

* * * * *